United States Patent
Killat

(10) Patent No.: US 6,573,752 B1
(45) Date of Patent: Jun. 3, 2003

(54) HIGH VOLTAGE PUSH-PULL DRIVER ON STANDARD CMOS

(75) Inventor: Dirk Killat, Kircheim (DE)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 4 days.

(21) Appl. No.: 10/043,748

(22) Filed: Jan. 10, 2002

(30) Foreign Application Priority Data

Jan. 3, 2002 (EP) .............................. 02368002

(51) Int. Cl.$^7$ ............................................. H03K 5/08
(52) U.S. Cl. .......................... 326/83; 326/63; 327/309; 327/379; 327/108
(58) Field of Search .................. 326/81, 83, 88, 326/63, 22, 23, 27; 327/108, 109, 112, 309, 379

(56) References Cited

U.S. PATENT DOCUMENTS

| | | | |
|---|---|---|---|
| 4,751,408 A | 6/1988 | Rambert | 307/571 |
| 4,906,904 A | 3/1990 | Tognoni | 315/408 |
| 6,005,415 A | * 12/1999 | Solomon | 326/83 |
| 6,081,132 A | 6/2000 | Isbara | 326/81 |
| 6,157,223 A | 12/2000 | Blake | 327/108 |
| 6,396,326 B1 | * 5/2002 | Chang | 327/309 |

FOREIGN PATENT DOCUMENTS

DE 4428548 A1 12/1994 ......... H03K/17/687

* cited by examiner

Primary Examiner—Michael Tokar
Assistant Examiner—Vibol Tan
(74) Attorney, Agent, or Firm—George O. Saile; Stephen B. Ackerman; Douglas R. Schnabel

(57) ABSTRACT

A new high voltage, high side driver circuit has been achieved. The circuit comprises, first, a top PFET having gate, drain, source, and bulk. The gate is coupled to a switching signal. The source is coupled to a high voltage. Second, a top resistor has first and second terminals. The first terminal is coupled to the high voltage. Third, a middle PFET cell comprises a middle PFET having gate, drain, source, and bulk. The source is coupled to the top PFET drain. The gate is coupled to the top resistor second terminal. A middle resistor has first and second terminals. The first terminal is coupled to the middle PFET gate. Finally, a middle means of claimping the middle PFET gate and a clamping voltage completes the middle PFET cell. Fourth, a bottom PFET cell comprises, first, a bottom PFET having gate, drain, source, and bulk. The gate is coupled to the middle resistor second terminal, the source is coupled to the middle PFET drain, and the drain forms a high side driver output. A bottom resistor is coupled between the bottom PFET gate and the high side driver output. Finally, a bottom means of clamping the bottom PFET gate and the clamping voltage completes the bottom cell. A low side driver is and a means of boosting the low side gate drive are disclosed. The means of clamping may be a diode or a bipolar transistor.

30 Claims, 9 Drawing Sheets

HIGH VOLTAGE PUSH-PULL DRIVER ON STANDARD CMOS

BACKGROUND OF THE INVENTION (1) Field of the Invention

The invention relates to a push-pull driver, and more particularly, to a high voltage, push-pull driver circuit compatible with standard CMOS devices.

(2) Description of the Prior Art

Input and output drivers are an especially challenging part of application specific integrated circuit (ASIC) design in advanced CMOS process. Advanced CMOS processes use very small device design rules, including shallow junctions and thin gate oxides. To compensate for these necessary device parameters, the internal voltage of the IC device is reduced to avoid voltage breakdown. However, it is usually necessary to maintain higher signal voltage levels external to the IC in order to maintain signal-to-noise ratios. In addition, external signals may be exposed to high voltage transient conditions; Therefore, the IC circuits that interface between the internal and external voltage levels are especially difficult to achieve.

Referring now to FIG. 1, a simplified output circuit for an integrated circuit is illustrated. In this circuit, a push-pull driver output is formed. In a push-pull driver, a switch P1 22 is provided to pull the output, OUT 10, to the upper rail voltage, VCC 26. A switch N1 14 is also provided to push OUT 10 to the lower rail, or ground, VSS 30. The output switches, P1 22 and N1 14 are controlled-such that only one switch is ON at any given time. The pull up driver may also be called a high side driver. The push down driver may also be called a low side driver.

In the example circuit, the VCC 26 level is biased to a relatively high-voltage compared to the internal VDD 50 voltage. For example, while the VDD 50 level is about 3 Volts, the VCC 26 is about 10 Volts. To handle the large voltage differential, the low voltage PFET devices, P1 22 and P2 18, are arranged in a cascade. The top PFET P1 22 has the gate terminal tied to the PFET switching signal, SWP 56, and is the switching device. The bottom PFET P2 18 is always biased ON. Typically, P1 22 and P2 18 are formed in separate n-wells and have source and bulk coupled. The voltage divider, R1 38 and R2 42, divides VCC 26 in half to create VCC/2 34.

The cascade arrangement and gate bias on P2 18 allows the low voltage PFET devices, P1 22 and P2 18, to effectively high side switch the VCC voltage 26 onto OUT 10. However, the arrangement suffers the disadvantage of a very limited VCC upper range. This is because this cascade structure cannot be effectively extended to greater than two cascaded devices without creating a sophisticated biasing circuit. It is essential that each PFET device in the cascade stack have a carefully regulated gate voltage so that gate oxide or gate-induced avalanche breakdown or drain-to-source punch through does not occur. Unfortunately, the cascade bias voltage cannot respond to changes in the output voltage.

In addition, the example push down, or low side driver, switch N1 14 suffers the disadvantage of insufficient gate drive. The NFET switching signal, SWN 58, is generated by the low voltage logic 46 that swings from VDD 50 to VSS 30. Therefore, the output NFET, N1 14, only has about a 3 Volt gate drive. To achieve a low impedance output, a very large NFET must be used. This costs a great amount of chip area.

Several prior art inventions describe output driver circuits. U.S. Pat. No. 6,081,132 to Isbara describes a push-pull CMOS driver with a cascaded PMOS section. The gate voltage of the cascaded devices is controlled using a biasing circuit. U.S. Pat. No. 6,157,223 to Blake teaches a push-pull CMOS driver with a cascaded PMOS section. The output voltage is fed back for gate biasing.

SUMMARY OF THE INVENTION

A principal object of the present invention is to provide an effective and very manufacturable high voltage, push-pull driver circuit.

A further object of the present invention is to provide a high voltage, push-pull driver that is compatible with standard CMOS.

A still further object of the present invention is to provide a high voltage, pull-up, or high side, driver using low voltage capable PFET devices.

A yet still further object of the present invention is to protect low voltage PFET devices by cascading devices.

Another yet still further object of the present invention is to protect the gate terminals of the PFET devices by limiting the gate voltage using a resistor network Another yet still further object of the present invention is to enhance the ESD capability by providing gate resistance, gate-to-source capacitance, and gate-to-drain capacitance on each of the cascaded FET devices.

Another yet still further object of the present invention is to insure the ON state of the PFET devices by limiting the gate voltage using a diode network.

A still further object of the present invention is to provide a high voltage, push, or low side, driver A yet still further object-of the present invention is to provide a boosted gate drive to reduce the ON resistance of a NFET output.

In accordance with, the objects of this invention, a new high voltage, high side driver circuit has been achieved. The circuit comprises, first, a top PFET having gate, drain, source, and bulk. The gate is coupled to a switching signal. The source is coupled to a high voltage. Second, a top resistor has first and second terminals. The first terminal is coupled to the high.voltage. Third, a middle PFET cell comprises, first, a middle PFET having gate, drain, source, and bulk. The source is coupled to the top PFET drain. The gate is coupled to the top resistor second terminal. A middle resistor has first and second terminals. The first terminal is coupled to the middle PFET gate. Finally, a middle means of clamping said middle PFET gate to a clamping voltage completes the middle PFET cell. Fourth, a bottom PFET cell comprises, first, a bottom PFET having gate, drain, source, and bulk. The gate is coupled to the middle resistor second terminal, the source is coupled to the middle PFET drain, and the drain forms a high side driver output. A bottom resistor is coupled between the bottom PFET gate and the high side driver output. Finally, a bottom means of clamping said bottom PFET gate to a clamping voltage completes the bottom PFET cell. The means of clamping may be a diode or a bipolar transistor.

Also in accordance with the objects of this invention, a new high voltage, low side driver circuit is achieved. The circuit comprises, first, an output NFET having gate, drain, and source. The source is coupled to ground, and the drain forms a low side driver output. A low voltage control means has an input and an output. The input and output voltages vary between ground and a low voltage. A diode is coupled between the low voltage control means output and the output NFET gate. Finally, a current mirror is coupled to the output NFET gate to pull the output NFET gate to a drive voltage above said low voltage to thereby reduce the ON resistance of the output NFET. The current mirror current is proportional to the output NFET drain current. The current mirror is switched OFF when the output NFET is OFF. The diode blocks the drive voltage from the low voltage control means.

Also in accordance with the objects of this invention, a new high voltage, low side driver circuit is achieved. The circuit comprises, first, a bottom NFET having gate, drain, source, and bulk. The gate is coupled to a switching signal, and the source is coupled to ground. Second, a bottom resistor has first and second terminals. The first terminal is coupled to ground. Third, a middle NFET cell comprises a middle NFET having gate, drain, source, and bulk. The source is coupled to the bottom NFET drain, and the gate is coupled to the bottom resistor second terminal. A middle resistor has first and second terminals. The first terminal is coupled to the middle NFET gate. A middle means of clamping the middle NFET gate to a clamping voltage completes the middle cell. Finally, a top NFET cell comprises, first, a top NFET having gate, drain, source, and bulk. The gate is coupled to the middle resistor second terminal, the source is coupled to the middle NFET drain, and the drain forms a low side driver output. A top resistor is coupled between the top NFET gate and the low side driver output. Finally, a top means of clamping the top NFET gate to the clamping voltage completes the top NFET cell.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a high side driver and a low side driver circuits with improved high voltage performance. These high side and low side drivers may be combined in a single application to create a push-pull output circuit.

Alternatively, the high side and low side driver circuits may be used independently. It should be clear to those experienced in the art that the present invention can be applied and extended without deviating from the scope of the present invention.

Figure 1:
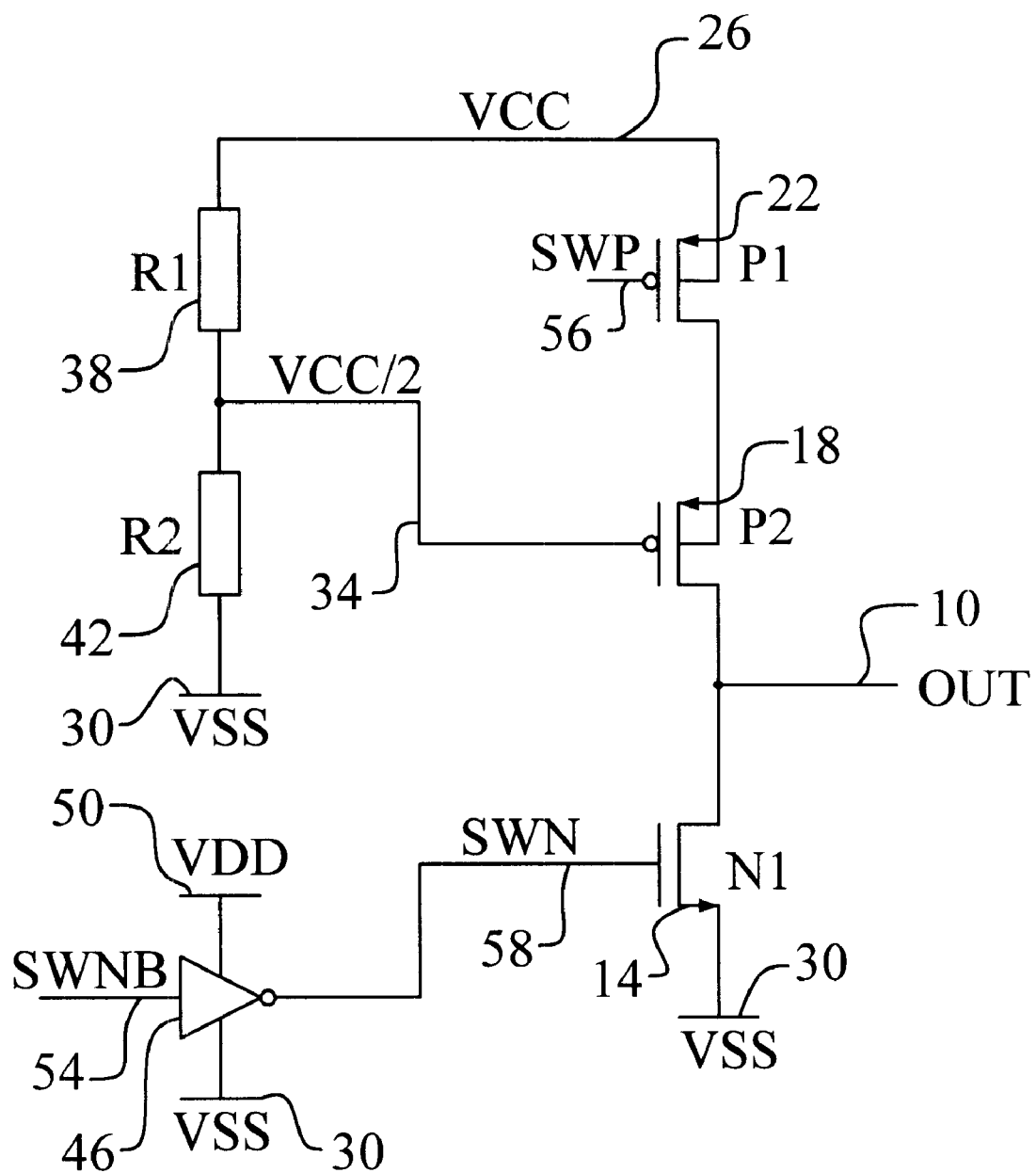
FIG. 1 illustrates a prior art, CMOS push-pull output.
Figure 2A:
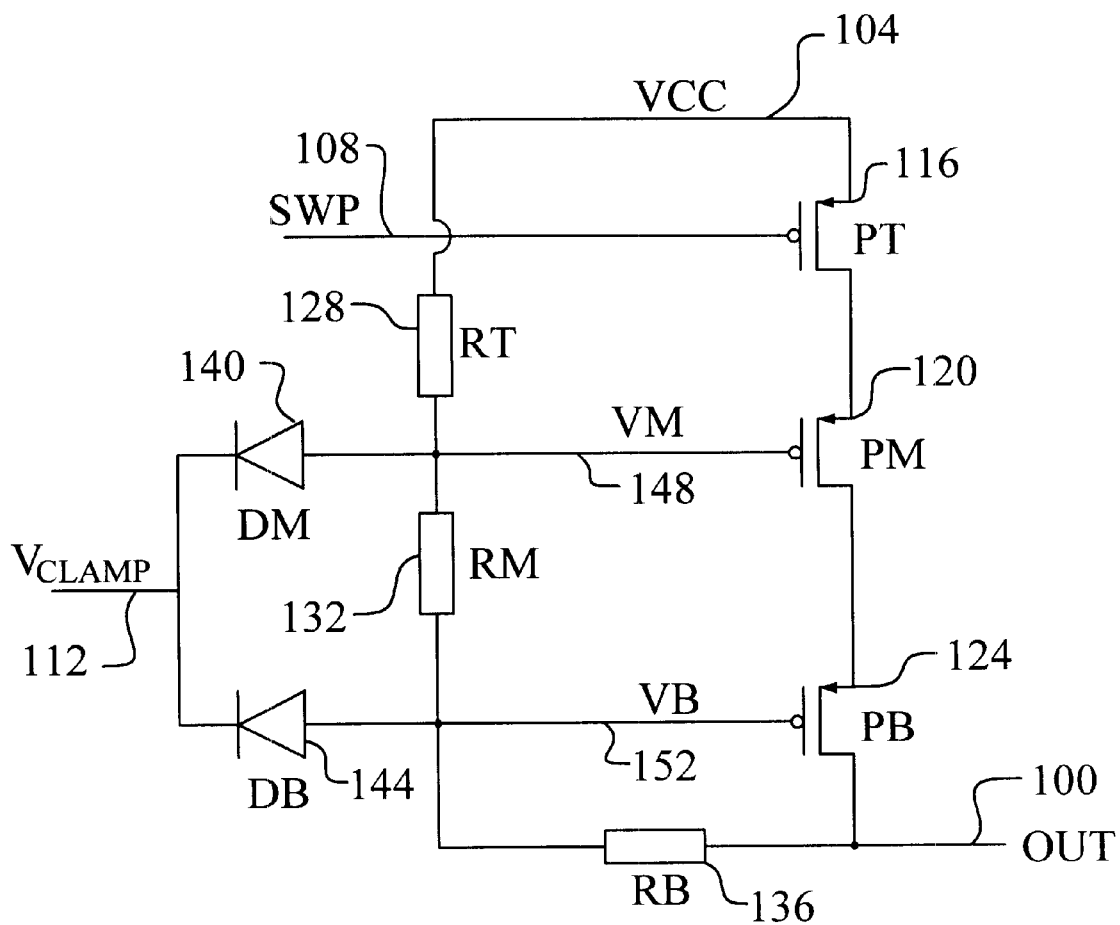
FIG. 2A illustrates a first preferred embodiment of the present invention high side driver with an improved PFET cascade structure.

Referring now to FIG. 2A, a first preferred embodiment of the present invention high side driver is illustrated. Several important features of the present invention are shown. A three PFET cascade stage is used. As will be seen in FIG. 3, the novel configuration may be extended to greater than three PFET devices.

Referring again to FIG. 2A, the high side driver is designed for switching a high voltage, VCC 104, relative to the logic low voltage, onto the output, OUT 100. A top PFET 116 has gate, drain, and source. The gate is coupled to a switching signal, SWP 108. SWP 108 switches between VCC level and a lower voltage below the threshold of P1 116. The source of P1 116 is coupled to VCC. A top resistor, RT 128, has first and second terminals. The first terminal is coupled to VCC.

A middle PFET cell comprises a PFET, PM 120, a resistor, RM 132, and a means of clamping DM 140 the middle PFET PM 120 gate to a clamping voltage $V_{CLAMP}$ 112. Preferably, the means of clamping comprises a diode, DM 140. The middle cell PFET PM 120 has gate, drain, source, and bulk. The PM 120 source is coupled to the top PFET PT 116 drain. The PM 120 gate is coupled to the second terminal of RT 128. The middle cell resistor PM 132 has first and second terminals. The RM 132 first terminal is coupled to the PM 120 gate. The middle cell diode DM 140 is coupled between the PM 120 gate and a clamping voltage, $V_{CLAMP}$ 112.

A bottom PFET cell comprises a PFET, PB 124, a resistor, RB 136, and a means of clamping DB 144 the gate of PB 124 to the clamping voltage $V_{CLAMP}$ 112. Again, the means of clamping preferably comprises a diode, DB 144. The bottom cell PFET, PB 124, has gate, drain, and source. The PB 124 gate is coupled to the middle cell resistor, RM 132, second terminal. The PB 124 source is coupled to the middle cell PFET, PM 120, drain. The PB 124 drain forms the high side driver output, OUT 100. The bottom cell resistor, RB 136, is coupled between the PB 124 gate and OUT 100. The bottom cell diode, DB 144, is coupled between the PB 124 gate and the clamping voltage, $V_{CLAMP}$ 112.

Resistors RT 128, RM 132, and RB 136, form a divider that optimally protects the PFET devices, 120 and 124, from large voltage differences between VCC and OUT. The voltage divider provides for variable voltage biasing on the gates of PM 120 and PB 124 that responds to changes in potential from VCC to OUT as the high side.driver switches from the OFF state to the ON state. For example, if the VCC voltage is nominally about 15 Volts, then the voltage drop across the cascade stack is about 15 Volts if OUT 100 is at about 0 Volts. It is necessary that the gates of PM 120 and PB 124 be biased so that these devices are always in the ON state. It is also important that the gate-to-source voltage and the gate-to-drain voltage of PM 120 and PB 124 not be so large that breakdown occurs.

Preferably, PM 120 and PB 124 are formed in separate n-well regions. Further, it is referred that the source and bulk (n-well) of PM 120 are coupled. The.source and bulk of PB 124 should also be coupled. If the drain-to-source breakdown voltage of PT, PM, and PB is much lower than the gate-to-source breakdown, then one or more of transistors PT, PM, and PB can be located in the same well.

RB 136 provides a feedback path for the OUT 100 voltage so that the gate biases on PM 120 and PB 124 will automatically track the OUT voltage. The resistor divider, RT 128, RM 132, and RB 136, may comprise resistors formed as diffusion regions, polysilicon resistors, or diode-connected PFET devices.

The presence of the means of clamping, DM 140 and DB 144, provides an absolute upper limit on the gate voltages of PM 120 and PB 124. The gate voltages are clamped to one diode drop (about 0.7 Volts) above the clamping voltage, $V_{CLAMP}$ 112. The clamping diodes insure that PM 120 and PB 124 remain ON even when the OUT voltage is nearly at the VCC level. The clamping voltage, $V_{CLAMP}$ 112, is less than VCC and may be between about 4 Volts and 6 Volts below VCC where VCC is about 15 Volts. The novel high side driver circuit can work with a VCC 104 voltage of up to about 3 times the standard supply voltage because of the novel method of biasing the cascade transistors.

Figure 2B:
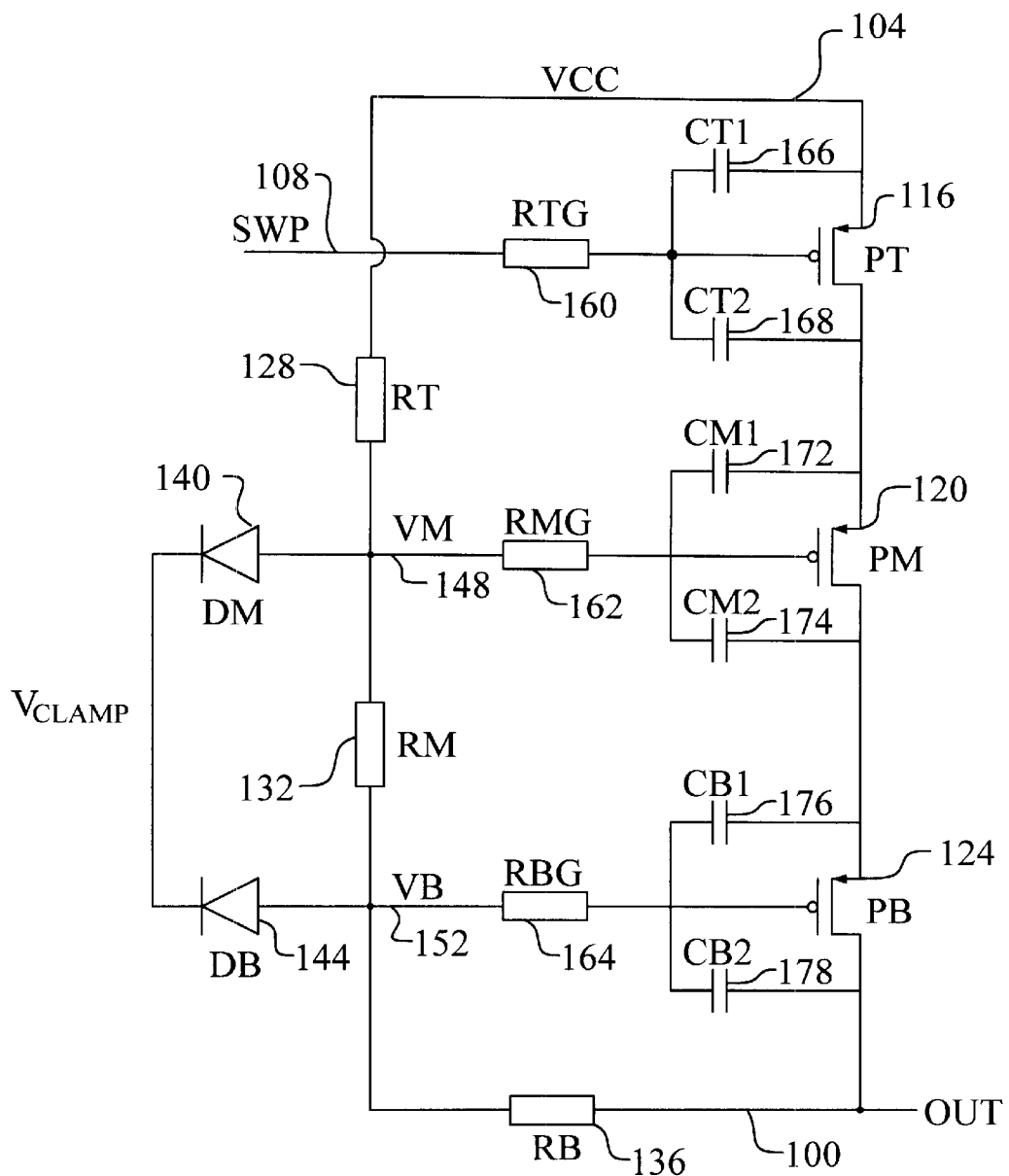
FIG. 2B illustrates a second preferred embodiment of the present invention high side driver where gate resistors, gate-to-drain capacitors, and gate-to-source capacitors are added to improve ESD performance.

Referring now to FIG. 2B, a second preferred embodiment of the present invention high side driver is illustrated where gate resistors, gate-to-drain capacitors, and gate-to-source capacitors are added to improve ESD performance. Here, the principle of the novel biasing of the cascaded transistors is extended by adding series gate resistance RTG 160, RMG 162, and RBG 164 to each of the cascaded transistors PT 116, PM 120, and PB 124, respectively. In addition, small gate-to-source and gate-to-drain capacitors are added to each of the cascaded transistors. Specifically, gate-to-source capacitors CT1 166, CM1 172, and CB1 176 are added to cascaded transistors PT 116, PM 120, and PB 124, respectively. Gate-to-drain capacitors CT2 168, CM2 174, and CB2 178 are added to cascaded transistors PT 116, PM 120, and PB 124, respectively. The presence of the gate resistors, the gate-to-drain capacitors, and the gate-to-source capacitors improves the ESD performance of the novel circuit.

Figure 3:
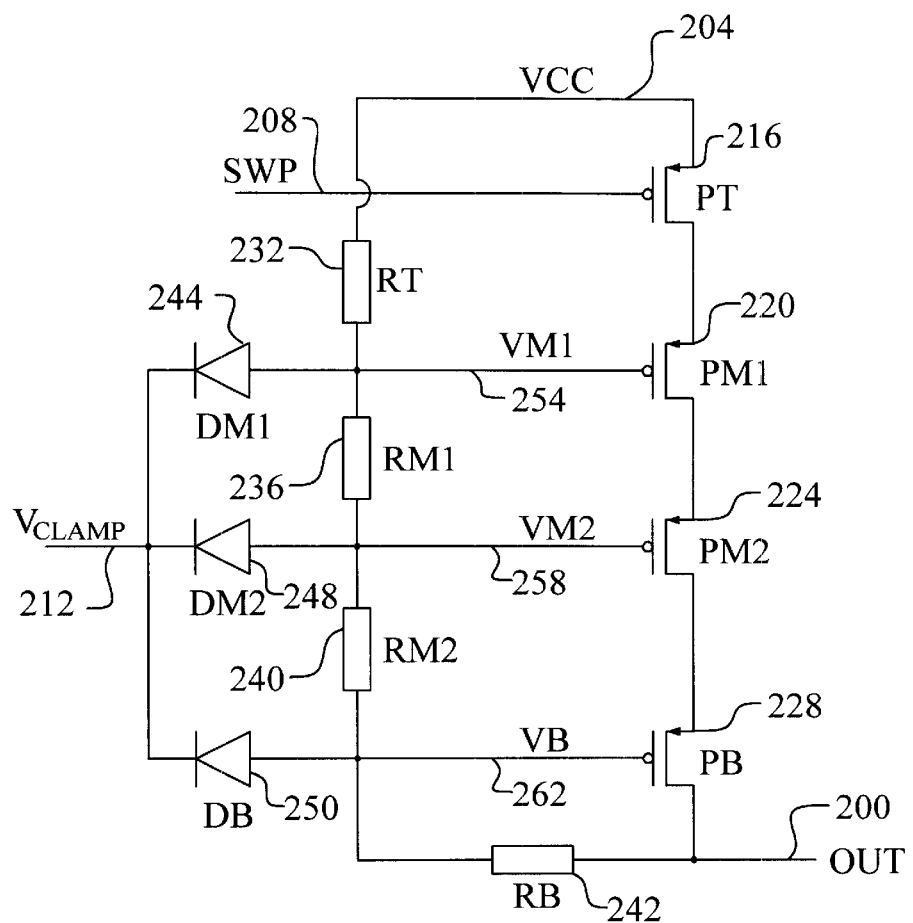
FIG. 3 illustrates a third preferred embodiment structure with a four PFET stack.

Referring now to FIG. 3, a third preferred embodiment structure with a four PFET stack is illustrated. More than four PFET devices may be stacked with each additional PFET cell added as shown in FIG. 3. Additional PFET devices extend the useful operating voltage on the VCC. To extend the stack, the middle cell components illustrated in FIG. 2 as PM, RM, and DM, are duplicated. Therefore, two middle cells are used in the cascade of FIG. 3. The first middle cell uses PM1 220, RM1 236, and DM1 244. The second middle cell uses PM2 224, RM2 240, and DM2 248. Note that each of the middle cells and the bottom cell are still clamped to the $V_{CLAMP}$ 212 voltage. In this configuration, the VCC 204 operating range can be extended to about four times the standard supply voltage.

Figure 4A:
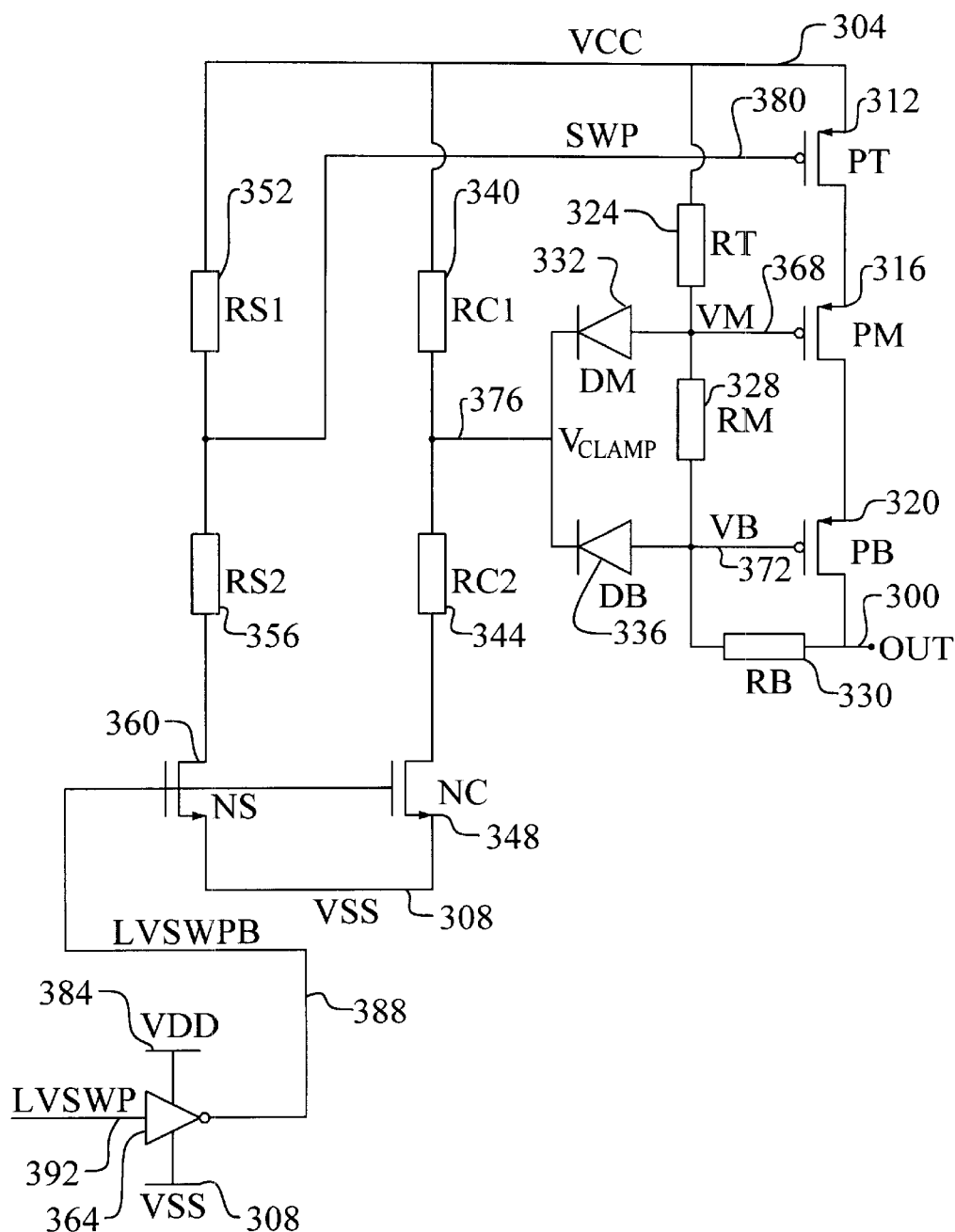
FIG. 4A illustrates a first preferred embodiment of a switching circuit and clamping voltage generator for the high side driver of the present invention.

Referring now to FIG. 4A, a first preferred embodiment of a switching circuit and a clamping voltage generator for the high side driver of the present invention is illustrated. The switching signal, SWP 380, is generated using the switched resistor divider comprising RS1 352, RS2 356, and NS 360. RS1 352 is coupled between VCC 304 and RS2 356. RS 2 356 is coupled between RS1 352 and the drain of NFET NS 360. When NS 360 is in the OFF state, SWP 380 is pulled to the VCC voltage by RS1 352. When NS 360 is ON, SWP 380 is driven to a fraction of VCC determined by the ratio of RS1 and RS2. By using a resistor divider, the asserted voltage SWP 380 can be selected to insure that the gate of PT 312 does not receive too low of a voltage and create a gate oxide breakdown condition. Since NS 360 is OFF when PT 312 is OFF, there is no static current draw in the resistor divider during the OFF state.

The clamping voltage, $V_{CLAMP}$ 376, is also preferably generated using a switched voltage divider comprising RC1 340, RC2 344, and NC 348. The purpose of $V_{CLAMP}$ 376 is to provide a voltage limit for the gates of the cascaded PFET devices PM 316 and PB 320 such that the gate voltages on PM and PB do not reach VCC. The worst case condition occurs when PT 312 is ON and OUT 300 is pulled high. In this condition, a small voltage drop occurs across the resistor divider comprising RT 324, RM 328, and RB 330. Therefore, the gates of PM and PB will be pulled up to nearly the VCC voltage by the resistor divider. Without the diode clamping scheme, PM 316 and PB 320 will de-bias and shut OFF. However, the diodes DB 336 and DM 332 clamp the gate voltages to a diode drop above $V_{CLAMP}$ 376. This guarantees that cascade devices remain ON. Since the $V_{CLAMP}$ 376 voltage is needed only when PT 312 is ON, the clamping voltage divider may be switched using NC 348. Therefore, there is again no static current draw when PT 312 is OFF. The resistors for the L switching circuit and for the clamping voltage circuit, RS1 352, RS1 356, RC1 340, and RC2 344, may comprise doped or undoped polysilicon resistors, diffusion resistors, or diode-coupled PFET devices.

Figure 4B:
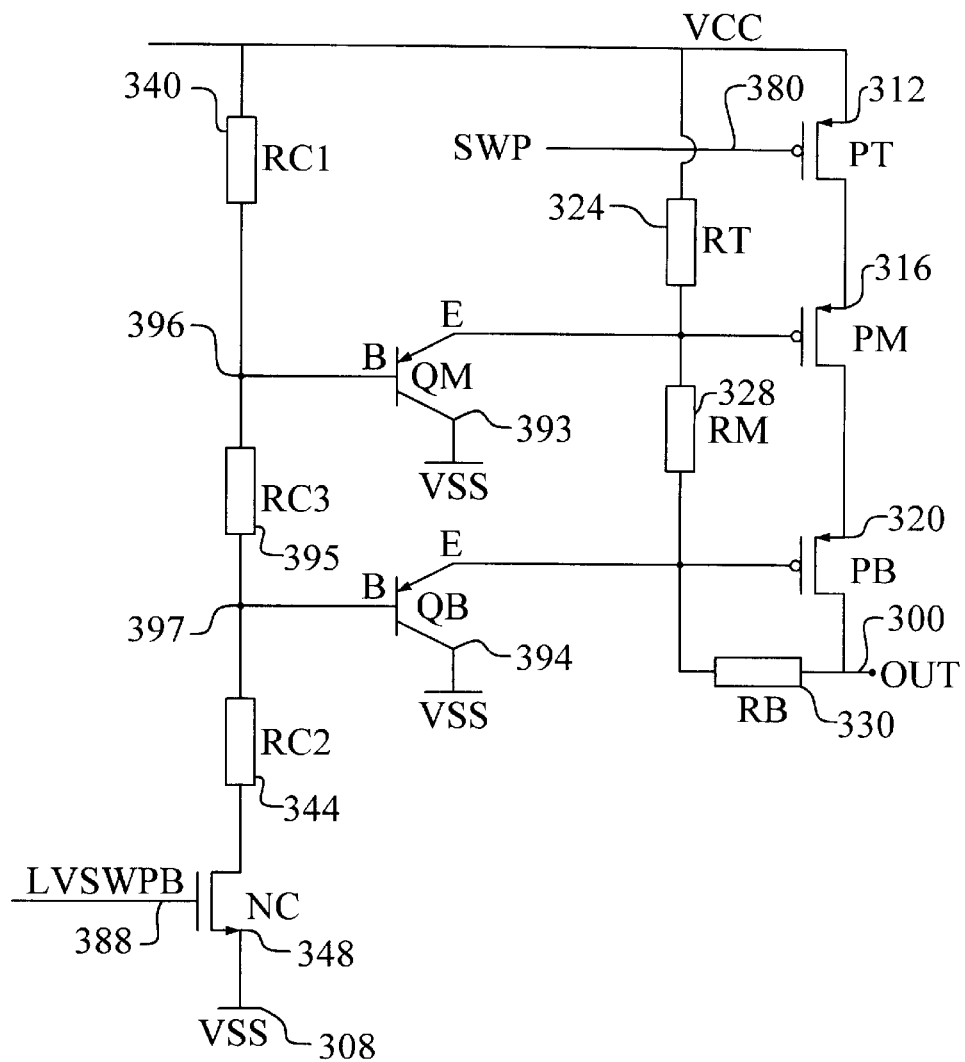
FIG. 4B illustrates a second preferred embodiment of a clamping voltage generator having lowered impedance.

FIG. 4B illustrates a second preferred embodiment of a clamping voltage generator having lowered impedance. For accurate clamping, the resistor values of RC1 340 and RC2 344 in the circuit of FIG. 4A cannot be very large. However, if bipolar transistors are used as the means of clamping instead of the diodes, then the values of the resistors in the divider can be made large. Referring again to FIG. 4B, bipolar p-n-p transistors QM 393 and QB 394 are used as the means of clamping. More specifically, the middle bipolar transistor QM 393 has emitter coupled to the gate of the middle PFET PM 316, base coupled to the clamping voltage 396, and collector coupled to ground VSS 308. The bottom bipolar transistor QB 393 has emitter coupled to the gate of the bottom PFET PM 316, base coupled to the clamping voltage 397, and collector coupled to ground VSS 308.

In case of clamping, most of the clamping current flows from the emitter to the collector of each p-n-p transistor. Only a small part of the current flows into the resistor network made up of RC1 340, RC3 395, and RC2 344. Therefore, the resistor network can comprise large value resistors. If RC3 395 is omitted, then the bases of QM 393 and QB 394 are coupled to the same clamping voltage and PM 316 and PB 320 are therefore clamped to the same voltage. If RC3 395 is used, then the clamping voltages can be different and circuit performance can be improved.

Figure 4C:
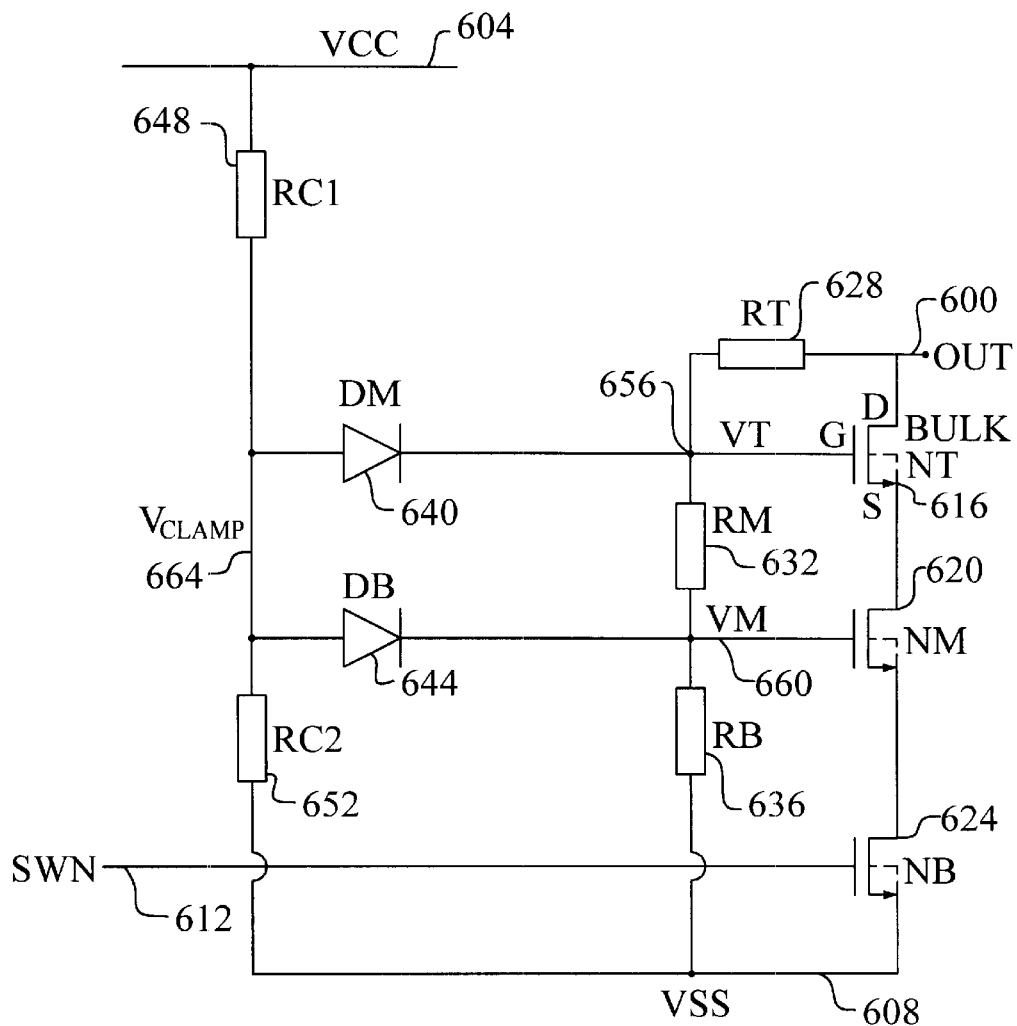
FIG. 4C illustrates a first preferred embodiment of the present invention, low side driver with an improved NFET cascade structure.

FIG. 4C illustrates a first preferred embodiment of the present invention, low side driver with an improved NFET cascade structure. The principle of cascading the transistors using a novel biasing scheme is applied to a low side driver using cascaded NMOS devices. This structure is preferably used in processes where isolated NMOS transistors are available, such as in p-well processes or triple-well processes.

The circuit comprises, first, a bottom NFET NB 624 having gate, drain, source, and bulk. The gate is coupled to a switching signal SWN 612, and the source is coupled to ground VSS 608. Second, a bottom resistor RB 636 has first and second terminals. The first terminal is coupled to ground VSS. Third, a middle NFET cell comprises a middle NFET NM 620 having gate, drain, source, and bulk. The source of NM is coupled to the bottom NFET NB 624 drain, and the gate of NM is coupled to the bottom resistor RB second terminal at node VM 660. A middle resistor RM 632 has first and second terminals. The first terminal of RM is coupled to the middle NFET NM gate. A middle means of clamping DB 644 the middle NFET NM 620 gate to a clamping voltage $V_{CLAMP}$ 664 completes the middle cell. Finally, a top NFET cell comprises, first, a top NFET NT 616 having gate, drain, source, and bulk. The gate of NT is coupled to the middle resistor RM second terminal at node VT 656. The source of NT is coupled to the middle NFET NM drain. The drain of NT forms a low side driver output OUT 600. A top resistor RT 628 is coupled between the top NFET NT gate and the low side driver output OUT. Finally, a top means of clamping DM 640 the top NFET NT gate to the clamping voltage $V_{CLAMP}$ 664 completes the top NFET cell.

As in the PFET, high side drive embodiments, the low side drive circuit can be combined with a high side drive circuit to form a push-pull output. In addition, it is preferred that each of the NFET devices, NB, NM, and NT, be formed in a separate well. Further, the bulk and source should be coupled. If the source-to-drain breakdown voltage of the NFET devices is lower than the gate-to-source breakdown voltage, then the devices can be formed in common wells without loss of high voltage performance. Finally, gate resistance, gate-to-source capacitance, and gate-to-drain capacitance can be added to each of the cascaded NFET transistors to further improve ESD performance of the circuit.

Figure 5:
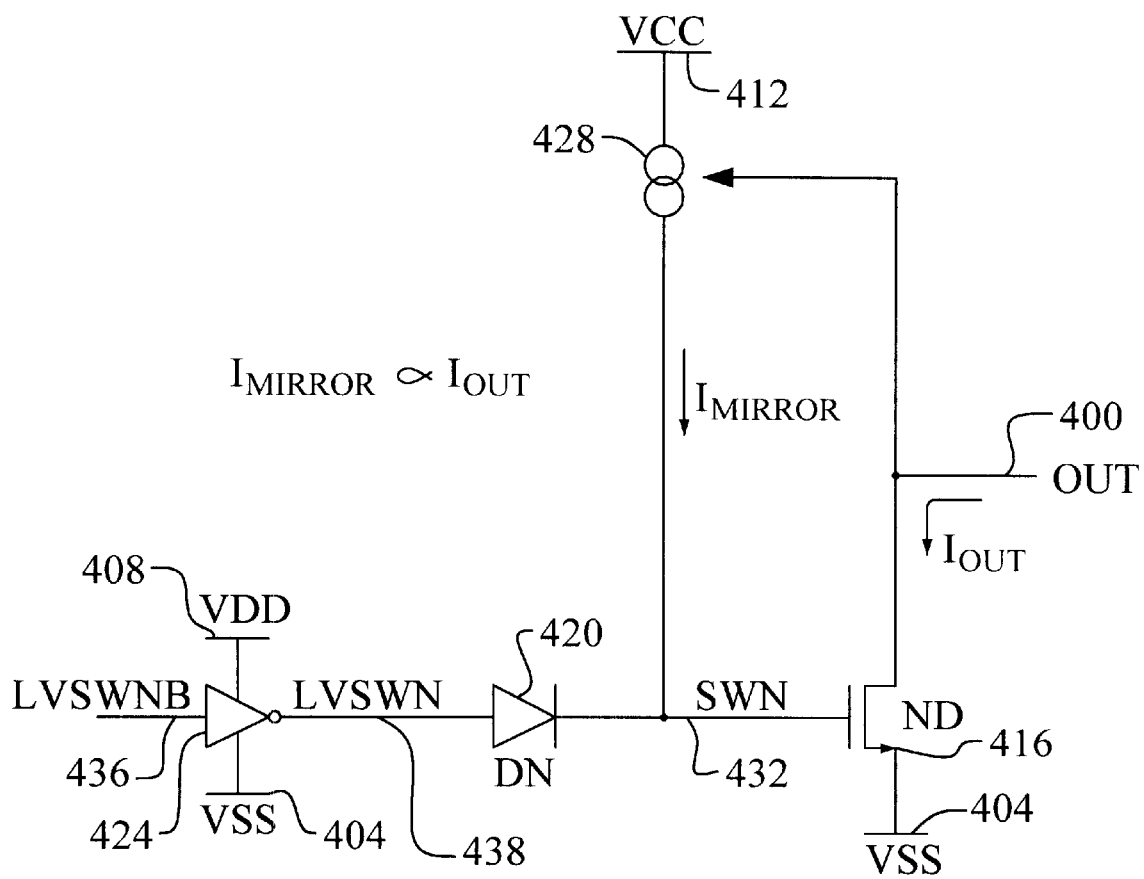
FIG. 5 illustrates a first preferred embodiment of the present invention, low side driver with a boosted gate drive.

Referring now to FIG. 5, a second embodiment of the present invention illustrates a low side driver. Once again, the high side driver of the first embodiment may be combined with the low side driver of the second embodiment to create a high voltage, push-pull output driver. Several important features of the present invention are illustrated in this embodiment.

The output, OUT 400, is driven by an NFET, ND 416 having gate, drain, and source. The ND 416 source is coupled to ground, while the drain forms the low side driver output. ND 416 is controlled by a low voltage control means 424 having an input, LVSWNB 436, and an output, LVSWN 438. LVSWNB 436 and LVSWN 438 voltages vary between ground and the logic low voltage, VDD 408. A diode, DN 420, is coupled between the low voltage control means output, LVSWN 438, and the gate of ND 416 at the node SWN 432. Most important, a current mirror 428 is coupled to the gate of ND 416 to pull the gate to a drive voltage above VDD when ND 416 is ON. The ON resistance of the ND 416 is reduced due to the increased gate drive. The current mirror 428 current is proportional to the ND 416 drain current. The current mirror 428 is switched OFF when the ND is OFF. The diode, DN 420, blocks the higher drive voltage from the low voltage control means 424.

Figure 6:
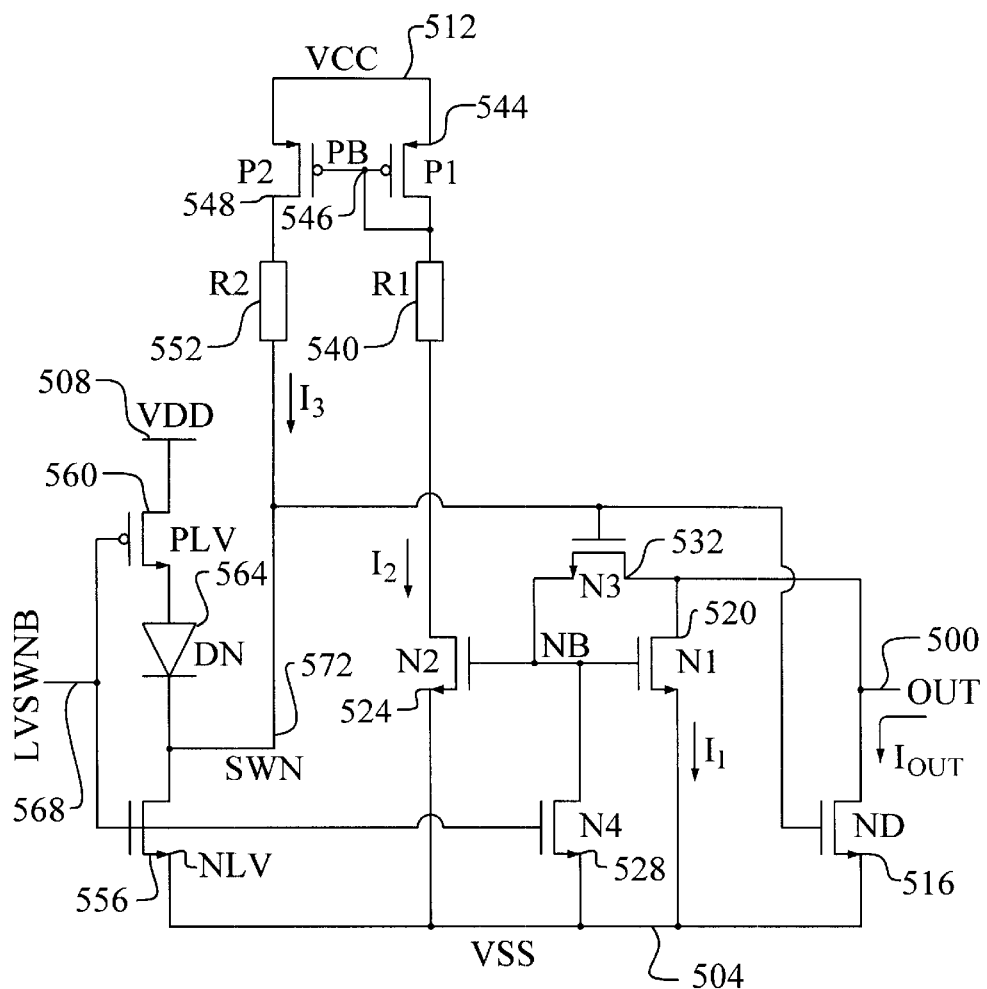
FIG. 6 illustrates a second preferred embodiment embodiment of the present invention, low side driver with a boosted gate drive including a detailed current mirror circuit.

Referring now to FIG. 6 the second embodiment is illustrated with the detailed current mirror circuit. The current mirror circuit preferably comprises a lower mirror and an upper mirror. The lower mirror comprises NFET devices, N1 520, N2 524, N3 532, and N4 528. The upper mirror comprises PFET devices, P1 544 and P2 548, and resistors, R1 540 and R2 552.

The lower mirror comprises, first, N1 520 having gate, drain, and source. The source is coupled to ground, or VSS 504, and the drain is coupled to the output ND 516 drain. N2 524 has gate, drain, and source. The gate is coupled to the gate of N1 520 to form the circuit node NB, or NBIAS. The source of N2 524 is coupled to ground 504. N3 532 has gate, drain, and source. The source of N3 532 is coupled to NB 536. The drain of N3 532 is coupled to the drain of ND 516. The gate of N3 is coupled to the gate of ND 516. N4 528 has gate, drain, and source. The source of N4 is coupled to ground. The drain of N4 is coupled to NB 536, and the gate is coupled to LVSWNB 568.

The upper mirror comprises P1 544 having gate, drain, and source. The source of P1 544 is coupled to the high voltage, or VCC 512. The gate and drain of P1 are coupled together. Resistor R1 540 is coupled between the drain of P1 544 and the drain of N2 524. PFET P2 548 has gate, drain, and source. The source of P2 548 is coupled to VCC 512 and the gate is coupled to the gate of P1 544 to form the PB 546, or PBIAS, node. Resistor R2 552 is coupled between the drain of P2 548 and the gate of the output NFET ND 516.

When the input signal, LVSWNB 568, is high, or not asserted, SWN 572 is driven to VSS 504 by the inverter formed by the PLV 560 and NLV 556. Therefore, ND 516 is OFF. In addition, N3 532 is OFF and N4 528 is ON. Therefore, the NB node is grounded and the lower current mirror is not conducting. The upper current mirror does not conduct since the lower mirror current, $I_2$, is OFF. Therefore, SWN 572 stays at VSS 504.

When LVSWNB 568 is low, the inverter formed by low voltage PFET PLV 560 and low voltage NFET 556 drives SWN 572 to the low voltage supply, VDD 508. Since VDD 508 may be at about 3 Volts, the available gate drive for ND 516 is limited. However, now N3 532 is ON and N4 528 is OFF. N3 connects NB 536 to OUT 500 and establishes the lower current mirror. N1 will conduct drain current, $I_1$, in proportion to the output current, $I_{OUT}$. Therefore, since N2 524 is commonly biased with N1 520 by node NB, current $I_2$ will mirror current $I_1$.

The lower current mirror current, $I_2$, creates the upper current mirror current, $I_3$. This current causes the SWN 572 voltage to rise and creates a larger gate drive on ND 516. Note that, due to. R2 552, SWN 572 does not rise all the way to near VCC. This is important because the ND 516 may not be capable of sustaining a gate voltage at the VCC 512 voltage.

The diode, DN 564, protects PLV 560 from the larger voltage on SWN 572. In practice, diode DN 564 may be formed by tying the bulk of PLV 560 to a voltage above VDD 508 during the output ON state. The upper mirror resistors R1 540 and R2 552 may be formed as diffusion resistors, doped or undoped polysilicon resistors, or diode-connected PFET devices to limit the drain-to-source voltage of P1 and P2; NLV and N2. The novel configuration of the second preferred embodiment allows the drive voltage to exceed VDD 508 by between about 1 Volts and 3 Volts where VDD is about 3 Volts and the maximum gate-to-source voltage of ND 516 is about 6 Volts. Higher voltage boost is possible and depends on scaling of current mirrors P1/P2 and N1/N2.

The present invention provides a unique and advantageous high voltage, push-pull output driver that is compatible with standard CMOS. The unique cascade biasing configuration facilitates a multiple transistor PFET cascade. The unique gate drive circuit for the NFET provides additional gate drive above the low voltage level.

The advantages of the present invention may now be summarized. First, An effective and very manufacturable high voltage, push-pull driver circuit is achieved. Second, the high voltage, push-pull driver is compatible with standard CMOS. Third, the high voltage, pull-up, or high side, driver uses low voltage capable PFET devices formed by cascading devices. Fourth, the PFET devices are prevented from breaking down by limiting the gate voltage using a resistor network. Fifth, the ON state of the PFET devices is insured by a diode network to a clamping voltage.

Sixth, a high voltage, push, or low side,.driver is achieved using an NFET device. Seventh, a boosted gate drive is provided to reduce the ON resistance of the NFET output. Finally, the low voltage control circuit is protected from the drive voltage by a diode.

As shown in the preferred embodiments, the novel current sense circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A high voltage, high side driver circuit comprising:
   a top PFET having gate, drain, source, and bulk wherein said gate is coupled to a switching signal and said source is coupled to a high voltage;
   a top resistor with first and second terminals wherein said first terminal is coupled to said high voltage;
   a middle PFET cell comprising:
      a middle PFET having gate, drain, source, and bulk wherein said source is coupled to said top PFET drain and said gate is coupled to said top resistor second terminal;
      a middle resistor having first and second terminals wherein said first terminal is coupled to said middle PFET gate; and
      a middle means of clamping said middle PFET gate to a clamping voltage; and
   a bottom PFET cell comprising:
      a bottom PFET having gate, drain, source, and bulk wherein said gate is coupled to said middle resistor second terminal, said source is coupled to said middle PFET drain, and said drain forms a high side driver output;
      a bottom resistor coupled between said bottom PFET gate and said high side driver output; and
      a bottom means of clamping said bottom PFET gate to said clamping voltage.

2. The circuit according to claim 1 wherein said middle means of clamping comprises a middle diode coupled between said middle PFET gate and said clamping voltage and said bottom means of clamping comprises a bottom diode coupled between said bottom PFET gate and said clamping voltage.

3. The circuit according to claim 1 wherein said middle means of clamping comprises a middle bipolar transistor having emitter coupled to said middle PFET gate, base coupled to said clamping voltage, and collector coupled to ground and said bottom means of clamping comprises a bottom bipolar transistor having emitter coupled to said bottom PFET gate, base coupled to said clamping voltage, and collector coupled to ground.

4. The circuit according to claim 1 wherein said clamping voltage is derived from a resistor voltage divider between said high voltage and said ground.

5. The circuit according to claim 4 further comprising a switch to shut OFF current in said resistor voltage divider when said switching signal is OFF.

6. The circuit according to claim 1 further comprising a means to create said switching signal from a low voltage signal comprising:
   an NFET having gate, drain, and source, wherein said gate is coupled to a low voltage signal and said source is coupled to ground;
   a first resistor coupled between said top PFET gate said NFET drain; and
   a second resistor coupled between said high voltage and said top PFET gate.

7. The circuit according to claim 1 further comprising at least one additional middle PFET cell and at least one additional clamping voltage to thereby create a cascaded stack greater than three PFET devices high.

8. The circuit according to claim 1 wherein each said PFET further comprises:
   a gate-to-drain capacitor;
   a gate-to-source capacitor; and
   a gate resistor.

9. The circuit according to claim 1 wherein each said PFET is formed in a separate well and wherein each said PFET bulk and source are coupled together but not to the remaining said PFET bulks and sources.

10. The circuit according to claim 1 further comprising a low side driver circuit coupled to said high side driver output such that a combined push-pull circuit is created.

11. A high voltage, high side driver circuit comprising:
    a top PFET having gate, drain, source, and bulk wherein said gate is coupled to a switching signal and said source is coupled to a high voltage;
    a top resistor with first and second terminals wherein said first terminal is coupled to said high voltage;
    a middle PFET cell comprising:
       a middle PFET having gate, drain, source, and bulk wherein said source is coupled to said top PFET drain and said gate is coupled to said too resistor second terminal;
       a middle resistor having first and second terminals wherein said first terminal is coupled to said middle PFET gate; and
       a middle means of clamping said middle PFET gate to a clamping voltage; and
    a bottom PFET cell comprising:
       a bottom PFET having gate, drain, source, and bulk wherein said gate is coupled to said middle resistor second terminal, said source is coupled to said middle PFET drain, and said drain forms a high side driver output;
       a bottom resistor coupled between said bottom PFET gate and said high side driver output, and
       a bottom means of clamping said bottom PFET gate to said clamping voltage; and
    a means to create said switching signal from a low voltage signal comprising:
       an NFET having gate, drain, and source, wherein said gate is coupled to a low voltage signal and said source is coupled to ground;
       a first resistor coupled between said top PFET gate and said NFET drain; and
       a second resistor coupled between said high voltage and said top PFET gate.

12. The circuit according to claim 11 wherein said middle means of clamping comprises a middle diode coupled between said middle PFET gate and said clamping voltage and said bottom means of clamping comprises a bottom diode coupled between said bottom PFET gate and said clamping voltage.

13. The circuit according to claim 11 wherein said middle means of clamping comprises a middle bipolar transistor having emitter coupled to said middle PFET gate, base coupled to said clamping voltage, and collector coupled to ground and said bottom means of clamping comprises a bottom bipolar transistor having emitter coupled to said bottom PFET gate, base coupled to said clamping voltage, and collector coupled to ground.

14. The circuit according to claim 11 wherein said clamping voltage is derived from a resistor voltage divider from said high voltage to said ground.

15. The circuit according to claim 14 further comprising a switch to shut OFF current in said resistor voltage divider when said switching signal is OFF.

16. The circuit according to claim 11 further comprising at least one additional middle PFET cell and at least one additional clamping voltage to thereby create a cascaded stack greater than three PFET devices high.

17. The circuit according to claim 11 wherein each said PFET further comprises:
 a gate-to-drain capacitor;
 a gate-to-source capacitor; and
 a gate resistor.

18. The circuit according to claim 11 wherein each said PFET is formed in a separate well and wherein each said PFET bulk and source are coupled together but not to the remaining said PFET bulks and sources.

19. The circuit according to claim 11 further comprising a low side driver circuit coupled to said high side driver output such that a combined push-pull circuit is created.

20. A high voltage, low side driver circuit comprising:
 an output NFET having gate, drain, and source, wherein said source is coupled to ground and said drain forms a low side driver output;
 a low voltage control means having an input and an output wherein said input and output voltages vary between ground and a low voltage;
 a diode coupled between said low voltage control means output and said output NFET gate; and
 a current mirror coupled to said output NFET gate to pull said output NFET gate to a drive voltage above said low voltage to thereby reduce the ON resistance of said output NFET wherein said current mirror current is proportional to said output NFET drain current, wherein said current mirror is switched OFF when said output NFET is OFF, and wherein said diode blocks said drive voltage from said low voltage control means.

21. The circuit according to claim 20 wherein said current mirror comprises:
 a first NFET having gate, drain, and source, wherein said source is coupled to ground and said drain is coupled to said output NFET drain;
 a second NFET having gate, drain, and source, wherein said gate is coupled to said first NFET gate and said source is coupled to ground;
 a third NFET having gate, drain, and source, wherein said source is coupled to said first NFET gate, said drain is coupled to said output NFET drain, and said gate is coupled to said output NFET gate;
 a fourth NFET having gate, drain, and source, wherein said source is coupled to ground, said drain is coupled to said first NFET gate, and said gate is coupled to said low voltage control means input;
 a first PFET having gate, drain, and source, wherein said source is coupled to said high voltage and wherein said gate and drain are coupled together;
 a first resistor coupled between said first PFET drain and said second NFET drain;
 a second PFET having gate, drain, and source, wherein said source is coupled to said high voltage and said gate is coupled to said first PFET gate; and
 a second resistor coupled between said second PFET drain and said output NFET gate.

22. The circuit according to claim 20 further comprising a high side driver circuit coupled to said low side driver output such that a combined push-pull circuit is created.

23. The circuit according to claim 22 wherein said high side driver comprises:
 a top PFET having gate, drain, source, and bulk wherein said gate is coupled to a switching signal and said source is coupled to a high voltage;
 a top resistor with first and second terminals wherein said first terminal is coupled to said high voltage;
 a middle PFET cell comprising:
  a middle PFET having gate, drain, source, and bulk wherein said source is coupled to said top PFET drain and said gate is coupled to said top resistor second terminal;
  a middle resistor having first and second terminals wherein said first terminal is coupled to said middle PFET gate; and
  a middle means of clamping said middle PFET gate to a clamping voltage; and
 a bottom PFET cell comprising:
  a bottom PFET having gate, drain, source, and bulk wherein said gate is coupled to said middle resistor second terminal, said source is coupled to said middle PFET drain, and said drain forms a high side driver output;
  a bottom resistor coupled between said bottom PFET gate and said high side driver output; and
  a bottom means of clamping said bottom PFET gate to said clamping voltage.

24. The circuit according to claim 23 wherein said middle means of clamping comprises a middle diode coupled between said middle PFET gate and said clamping voltage and said bottom means of clamping comprises a bottom diode coupled between said bottom PFET gate and said clamping voltage.

25. The circuit according to claim 23 wherein said middle means of clamping comprises a middle bipolar transistor having emitter coupled to said middle PFET gate, base coupled to said clamping voltage, and collector coupled to ground and said bottom means of clamping comprises a bottom bipolar transistor having emitter coupled to said bottom PFET gate, base coupled to said clamping voltage, and collector coupled to ground.

26. A high voltage, low side driver circuit comprising:
 a bottom NFET having gate, drain, source, and bulk wherein said gate is coupled to a switching signal and said source is coupled to ground;
 a bottom resistor with first and second terminals wherein said first terminal is coupled to said ground;
 a middle NFET cell comprising:
  a middle NFET having gate, drain, source, and bulk wherein said source is coupled to said bottom NFET drain and said gate is coupled to said bottom resistor second terminal;
  a middle resistor having first and second terminals wherein said first terminal is coupled to said middle NFET gate; and
  a middle means of clamping said middle NFET gate to a clamping voltage; and
 a top NFET cell comprising:
  a top NFET having gate, drain, source, and bulk, wherein said gate is coupled to said middle resistor second terminal, said source is coupled to said middle NFET drain, and said drain forms a low side driver output;

a top resistor coupled between said top NFET gate and said low side driver output; and a top means of clamping said top NFET gate to said clamping voltage.

27. The circuit according to claim 26 wherein said middle means of clamping comprises a middle diode coupled between said middle NFET gate and said clamping voltage and said top means of clamping comprises a top diode coupled between said top NFET gate and said clamping voltage.

28. The circuit according to claim 26 wherein each said NFET is formed in a separate well and wherein each said NFET bulk and source are coupled together but not to the remaining said NFET bulks and sources.

29. The circuit according to claim 26 further comprising at least one additional middle NFET cell and at least one additional clamping voltage to thereby create a cascaded stack greater than three NFET devices high.

30. The circuit according to claim 26 further comprising a high side driver circuit coupled to said low side driver output such that a combined push-pull circuit is created.

* * * * *

UNITED STATES PATENT AND TRADEMARK OFFICE
CERTIFICATE OF CORRECTION

PATENT NO.    : 6,573,752 B1
DATED         : June 3, 2003
INVENTOR(S)   : Dirk Killat It is certified that error appears in the above-identified patent and that said Letters Patent is hereby corrected as shown below:

<u>Title page,</u>
Item [75], delete "Dirk Killat, Kircheim (DE)", and replace with
-- Dirk Killat, Kirchheim (DE) --.

Signed and Sealed this

Sixteenth Day of September, 2003

JAMES E. ROGAN
*Director of the United States Patent and Trademark Office*